United States Patent [19]

Witt, III

[11] Patent Number: 5,047,656
[45] Date of Patent: Sep. 10, 1991

[54] CONTINUOUS DUTY CIRCUITRY FOR HIGH SPEED SWITCHING OF CURRENT FROM A CONSTANT CURRENT SOURCE

[75] Inventor: Louis R. Witt, III, Towson, Md.
[73] Assignee: Westinghouse Electric Corp., Pittsburgh, Pa.
[21] Appl. No.: 555,340
[22] Filed: Jul. 19, 1990
[51] Int. Cl.$^5$ ............... H03K 19/0175; H03K 17/60; H03K 19/094
[52] U.S. Cl. .................. 307/255; 307/254; 307/475; 307/451; 307/270
[58] Field of Search ........... 307/254, 270, 451, 296.1, 307/296.6, 296.7, 255, 241, 475

[56] References Cited

U.S. PATENT DOCUMENTS 4,227,095 10/1980 Bazil ............................ 307/494
4,616,142 10/1986 Upadhyay et al. ............. 307/254
4,780,688 10/1988 Groom ........................... 330/261
4,866,312 9/1989 Kearney et al. ................ 307/496
4,883,992 11/1989 Koglin et al. .................. 307/491

Primary Examiner—Stanley D. Miller
Assistant Examiner—Trong Phan
Attorney, Agent, or Firm—John K. Williamson

[57] ABSTRACT

A high speed current switch circuit comprises two sets of transistors, with each set containing a transconductance multiplier pair. These transistor sets alternate in operation to steer the current from a continuous-output constant current source either to an external load or to an internal dummy load. The circuit design allows switching of currents on the order of 80 milliamps using low-power, low-cost components. The circuit has high input impedance, low output impedance, and provides very fast switching times. The circuit can operate in either pulsed or continuous duty modes without damage and can operate with a short-circuited load.

21 Claims, 1 Drawing Sheet

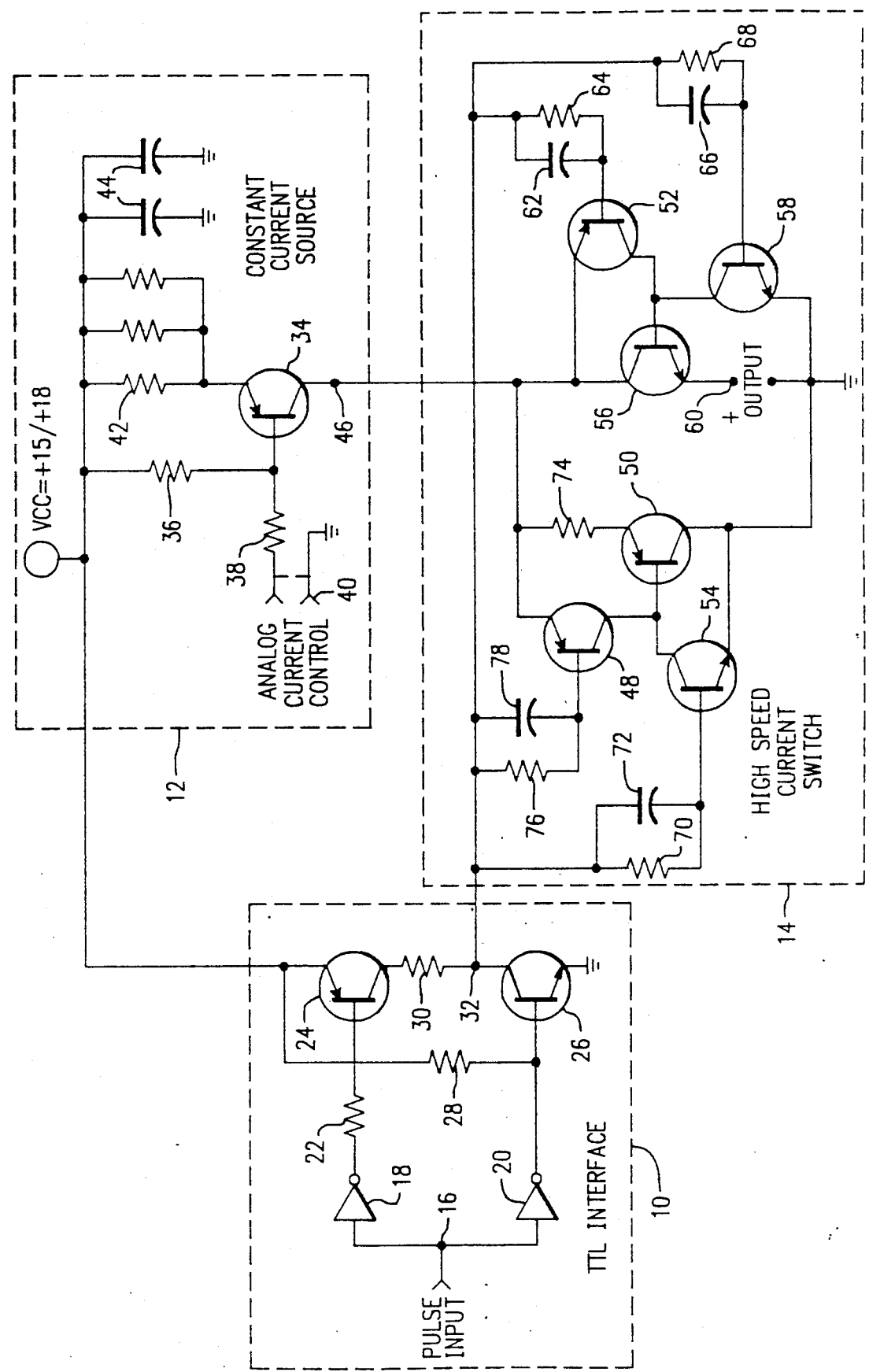

CONTINUOUS DUTY CIRCUITRY FOR HIGH SPEED SWITCHING OF CURRENT FROM A CONSTANT CURRENT SOURCE

BACKGROUND OF THE INVENTION

The present invention relates to circuitry for switching electrical current at high speed.

In many applications, and particularly in electronic circuit testing, there is a need to control current flow through a load so that the current can be turned on and off at very high speeds. Such current switching has traditionally been accomplished by using specially selected transistors, SCRs, or other circuit elements. However, these components are limited in their speed of switching, their current capability, and their input-/output impedance characteristics. Prior art systems tend to be optimized for either a high switching speed or continuous operation stability in the conductive (on) state, but not both. Prior art switching techniques that have been optimized for high speed switching suffer from poor reliability when used in continuous duty situations because the components tend to overheat and fail. Conversely, prior art switching techniques that have been optimized for stable "on" operation suffer from degraded switching characteristics.

The foregoing shortcomings are particularly evident in prior art circuits designed to test F16 Low Noise Assemblies. To effectively test such circuits, the high speed switching (approximately 3nS.) of high level currents (70-80mA) into a low impedance ground referenced load is necessary, while maintaining a high input impedance (15,000 to 24,000 ohms) and a low output impedance (12-50 ohms). Continuous duty capability is necessary, as well as the ability to withstand short circuit load conditions. Prior art testing circuits attempted to meet this criteria by means of a transistor operated constant current source that was also a switching transistor. The power transistor in the constant current source/switch regulated the current output when the 70-80 milliamperes current was being conducted through the Low Noise Assembly. While such prior art testing circuits were able to switch currents of this magnitude at moderately high speeds, this could only be accomplished by hand selection of the resistors and other components to adjust the output current level of the circuit. Additionally, the thermal stresses to which the switching transistor was subjected as a result of the continuous operation of the testing circuit created instabilities in its switching characteristics which, in the short run, affected its reliability and in the long run necessitated its replacement, along with the replacement of the surrounding precision resistors. These same thermal stresses that adversely affected the reliability of the transistor also caused undesired variations in the output current level conducted to the load. While the Low Noise Assemblies could be successfully tested by these prior art testing circuits despite the instabilities caused by the thermal stresses on the current control and switching transistor, the resulting inconsistencies in the switching characteristics and current level necessitated programmed delays, calibrations and corresponding adjustments to the test results to compensate for inaccuracies. Accordingly, there is a need for a high speed current switch which can switch currents on the order of 70 to 80 milliAmperes within 3 nanoseconds into a low-impedance ground referenced load of 0-50 Ohms while maintaining a relatively high input impedance of 15 to 24 kiloOhms and low output impedance of 12 to 50 Ohms with continuous duty capability even under short circuit load conditions.

SUMMARY OF THE INVENTION

Therefore, it is a general object of the present invention to provide a novel current switch circuit.

It is an object of the present invention to provide a novel high speed current switch that can switch significant currents using low-power, low-cost components.

It is a further object of the present invention to provide a novel high speed current switch that has high input impedance, low output impedance, and fast switching response times.

Another object of the invention is to provide a novel high speed current switch that steers current alternately to a dummy load or an external load in response to control signals.

A further object of the present invention is to provide a novel high speed current switch that can operate reliably in either pulsed or continuous duty mode for long periods of time without damage to switch components.

Yet another object of the invention is to provide a novel high speed current switch that can withstand short circuit load conditions.

It is another object of the invention to provide a novel high speed current switch that uses transconductance multiplier transistor pairs to provide high-speed current switching operations.

These objects and others are achieved by providing a high speed current switch circuit comprising two sets of transistors, with each set containing a transconductance multiplier pair. These transistor sets alternate in operation to steer the current from a continuous-output constant current source either to an external load or to an internal dummy load. The circuit design allows switching of currents on the order of 80 milliamps using low-power, low-cost components. The circuit has high input impedance, low output impedance, and very fast switching times. The circuit can operate in either pulsed or continuous duty modes without damage and can operate with a short-circuited load.

BRIEF DESCRIPTION OF THE DRAWINGS

FIG. 1 is a schematic diagram of the circuit of the present invention.

DETAILED DESCRIPTION OF A PREFERRED EMBODIMENT

Referring now to FIG. 1, the circuit of the present invention is shown in detail. The circuit comprises a TTL interface section 10, a constant current source section 12, and a high speed current switch section 14.

The TTL interface section 10 accepts a digital pulse input at control terminal 16. As will be seen, the level of the digital pulse input determines the level of the output signal of TTL interface section 10, which determines whether the high speed current switch section 14 is placed in a conductive or non-conductive state. The TTL interface section 10 is necessary because the pulse input at control terminal 16 may come from a digital circuit which does not have the desired output characteristics to demonstrate the high speed current switch section 14. The output of TTL interface section 10 provides an input to the very high input impedance presented by the control terminal of the high speed current switch (Section 14).

The control terminal 16 is connected to the input terminals of inverters 18 and 20 which may be 7406 integrated circuits. The output terminal of inverter 18 is connected through 4700 Ohm resistor 22 to the base of PNP transistor 24. The output terminal of inverter 20 is connected to the base of NPN transistor 26. The emitter of transistor 24 is connected through a 4700 Ohm resistor 28 to the base of transistor 26, and is also connected to a power supply Vcc which preferably has an output in the range of 15 to 18 volts DC. Transistor 24 may be a 2N4209, and transistor 26 may be a 2N2369A. The collector of transistor 24 is connected through a 240 Ohm resistor 30 to the emitter of transistor 26. The emitter of transistor 26 is connected to ground. A control signal output terminal 32 is connected to the collector of transistor 26 and forms the output of TTL interface section 10 which is a control signal input to the high speed current switch section 14. When the input at input terminal 16 is "high", the output at control signal output terminal 32 will be "high", and when the input at input terminal 16 is "low", the output taken at the control signal output terminal 32 will be "low".

The operation of the constant current source section 12 will now be described in detail. The current source section 12 includes a power transistor 34, which may be a TIP30 PNP transistor. The base of transistor 34 is connected through a 562 Ohm resistor 36 to Vcc, and through a 487 Ohm resistor 38 to an analog current control 40. The analog current control 40 may take a number of forms and is not shown in detail. In this embodiment, the current control was designed to set the regulated output current level in response to the output of a digital-to-analog converter (DAC), not shown. In one embodiment, the analog current control 40 might be a circuit responsive to the current output of the constant current source section. In the present embodiment, the analog current control is a simple potentiometer connected between the resistor 38 and ground. The emitter of power transistor 34 is connected through a resistance 42 to Vcc. The resistance 42 may consist of three 267 Ohm resistors connected in parallel. Filter capacitors 44 are connected between Vcc and ground. In the diagram, two filter capacitors 44 are shown, and these capacitors preferably have capacitances of 0.01 microFarads and 47 microFarads respectively. The collector of power transistor 34 is connected to a current output terminal 46 which is a source of power for the high speed current switch section 14.

The analog current control 40, along with the resistors 36 and 38, forms a voltage divider between Vcc and ground. The analog current control 40 can be adjusted to vary the voltage present at the base of power transistor 34, thus varying the current flow through power transistor 34 to achieve the desired current output at power output terminal 46.

The high speed current switch section 14 comprises three PNP transistors 48, 50, and 52 (which may be 2N4209 transistors), three NPN transistors 54, 56, and 58 (which may be 2N2369A transistors), and associated resistors and capacitors. The high speed current switch section 14 has two current pathways, each comprising a three-transistor switching assembly.

The first of the current pathways is controlled by trigger transistor 52, series pass transistor 56, and cutoff transistor 58 and their associated base resistors and bypass capacitors. The transistors 52 and 56 are connected in a configuration which will be referred to hereafter as a transconductance multiplier configuration. This configuration has been found to provide a very high gain (hFE > 1000) and very fast switching times within the present circuit because the configuration results in non-saturated switching of output transistor 56. As can be seen in the diagram, the emitter of trigger transistor 52 is connected to the collector of series pass transistor 56, and the base of series pass transistor 56 is connected to the collector of trigger transistor 52.

The collector of series pass transistor 56 is connected to the power output terminal 46 of constant current source section 12. The emitter of series pass transistor 56 is connected to a switching terminal 60. The base of trigger transistor 52 is connected to the control signal output terminal 32 of TTL interface section 10 through resistor 64 and capacitor 62, which are in parallel. The resistor 64 may be a 24 or 32 kiloOhm resistor. The capacitor may be a 6.8 picoFarad capacitor. The resistor 64 operates to slightly reduce the voltage at the base of trigger transistor 52, ensuring proper bias of the transistors 52 and 56, and also limits current flow into the trigger transistor 52. The capacitor 62 is a speedup capacitor that dynamically bypasses resistor 64 so that the trigger transistor 52 responds more quickly to changes in the signal at control signal output terminal 32.

The switch load (not shown) to be controlled by the high speed current switching circuit of the present invention is connected between the switching terminal 60 and ground. When the first current path is activated, current will flow from current regulator output terminal 46 through transistor 56 to the switching terminal 60 and thus to the external load.

The base of cutoff transistor 8 is connected through capacitor 66 and resistor 68, which are connected in parallel (and which may have a capacitance and resistance of 8.2 picoFarads and 15 kiloOhms, respectively) to the control signal output terminal 32 of TTL interface section 10. The collector of cutoff transistor 58 is connected to the base of series pass transistor 56. The emitter of the cutoff transistor 58 is connected to ground. Thus, the first current path has been described.

The second current path comprises cutoff transistor 48, series pass transistor 50, trigger transistor 54, and their associated base resistors and bypass-capacitors. The transistors 50 and 54 are connected in a transconductance multiplier pair configuration, with the base of series pass transistor 50 connected to the collector of trigger transistor 54 and the collector of series pass transistor 50 connected to the emitter of trigger transistor 54. The emitter of trigger transistor 54 is also connected to ground. The base of the trigger transistor 54 is connected through resistor 70 and capacitor 72 (which are connected in parallel) to the control signal output terminal 32 of TTL interface section 10. The resistor 70 may be 82 kiloOhms. The capacitor 72 may be 8.2 picoFarads. The resistor 70 operates to reduce the voltage at the base of trigger transistor 54, ensuring proper bias of the transistors 54 and 50, and also limits current flow into the trigger transistor 54. The capacitor 72 is a speedup capacitor that dynamically bypasses resistor 70 so that the trigger transistor 54 responds more quickly to changes in the signal at control signal output terminal 32.

The emitter of series pass transistor 50 is connected through a dummy load 74 to the power output terminal 46 of constant current source section 12. The dummy load 74 is shown here as a 47 Ohm, one-watt power resistor, and is chosen to have impedance characteristics similar to the impedance characteristics of the switching load connected between switching terminal 60 and ground. The circuit shown in FIG. 1 was designed to switch a substantially resistive load of about 50 Ohms. If another type of switching load was provided, the resistance of the dummy load 74 could be altered and inductive or capacitive components could be provided in the dummy load 74 if desired.

The emitter of the cutoff transistor 48 is connected to the power output terminal 46 of constant current source section 12. The collector of cutoff transistor 48 is connected to the base of series pass transistor 50. The base of cutoff transistor 48 is connected through resistor 76 and capacitor 78, which are connected in parallel, (and which may have a resistance and capacitance of 3300 Ohms and 39 picoFarads respectively) to the control signal output terminal 32 of TTL interface section 10.

When the second current pathway is activated, current will flow from the power output terminal 46 through the dummy load 74 and through the series-pass transistor 50 to ground. Thus, the second current pathway has been described in detail. It will be noted by those skilled in the art that the second current pathway is in general an image through two perpendicular mirrors of the first current pathway.

The two current pathways of the high speed current switch section 14 operate alternately depending on the state of the control signal from TTL interface section 10. That is, one and only one of the current paths will be carrying the current output of the constant current source section 12 at any given time, and the current path to be activated is selected by the control signal from TTL interface section 10. The selection of the current path in response to control signals occurs in the following manner: When the output signal of TTL interface section 10 at control signal output terminal 32 is low, cutoff transistor 58 will not conduct. Transistors 52 and 56 will become conductive very quickly, so that current flows through the first current path. Current from the power output terminal 46 of the constant current source section 12 is provided to the load at the switching terminal 60. If the signal at control signal output terminal 32 goes high, transistors 52 and 56 will cease to conduct, and cutoff transistor 58 will begin conducting. Cutoff transistor 58 acts to drain any existing charge at the base of series pass transistor 56, thus producing a faster cutoff of transistor 52. As can be seen, when the control signal at control signal output terminal 32 goes high, the first current pathway consisting of transistors 52, 56, and 58 responds very quickly and ceases conducting current through the switching terminal 60 to the switching load.

When the signal at the control signal output terminal 32 is low (that is, when the first current path is conducting), the second current path will not conduct. The low signal at terminal 32 causes transistors 50 and 54 not to conduct. Cutoff transistor 48, however, will conduct, providing a Rapid discharge of the charge at the base of series pass transistor 50, thus producing a faster cutoff of the series pass transistor 50. If the signal at the control signal output terminal 32 goes high, cutoff transistor 48 will cease to conduct. Transistors 50 and 54 will immediately begin to conduct, so that current flows through the second current path that includes the dummy load 74. The operating characteristics of the high speed current switch of the present invention make the circuit particularly useful in electronics testing. The high speed current switch, as shown, produces rise and fall times on the order of three nanoseconds across the switching load, so that the current across the switching load can be pulsed on and off very quickly if desired. Further, the circuit will not be damaged by operation in a continuous duty mode wherein current is applied continuously for long periods to the switching load. The circuit will not be damaged by operation across a short-circuited switching load. Although the circuit has been described primarily in terms of electronic systems testing, it could be applied in other situations where very high speed switching of currents is required, such as in controlling high-power LED devices for fiber-optic data communications. Different components could be substituted so that the switch would function with higher current levels, if desired.

Stable operation of the constant current source section 12 is possible because of the unique operation of the high speed current switch section 14. The output current of the constant current source section 12 is maintained at a constant level and steered either to the switching load or to the internal dummy load depending on the operating mode selected. This unique design provides greater switching speed and permits use of a less-sophisticated current source since the current source need not change its output in response to switching control signals.

It should be noted that power dissipation in the series pass transistors 50 and 56 is held to a minimum since during operation, the series pass transistors 50 and 56 are clamped in their active regions; that is, at a point where they are not saturated, but very near saturation. The design allows the use of low-cost, low power, high speed, small-signal semiconductors throughout, even though current on the order of 70 milliAmperes is being switched at high speeds in the circuit. In the circuit shown, power dissipation in the series pass transistors 50 and 56 is 80 milliwatts or less with a load current of up to 80 milliamps.

I claim:

1. A high speed switching circuit for controlling transmission to a load of a current flow generated by a current source, comprising:

first and second transistor switching means each having a power input, a power output, and at least one control input, wherein the power input of each switching means is connected to the current flow generated by the current source, and the power outputs of the first and second transistor switching means connected to a load and a dummy load, respectively, and control means connected to at least one control input of each switching means for generating first and second control signals, wherein the switching means are responsive to the control signals to change their conductive states in complementary fashion to alternately steer said current flow to said load and said dummy load, respectively.

2. A high speed switching circuit as defined in claim 1, wherein each switching means is a transistor circuit including a pair of transconductive transistors.

3. A high speed switching circuit as defined in claim 2, wherein each switching means further includes cutoff means for expediting a change in the state of said transconductive transistors from conductive to nonconductive.

4. A high speed switching circuit as defined in claim 1, wherein the impedances of said load and said dummy load are of approximately the same magnitude.

5. A high speed switching circuit as defined in claim 1, wherein each of said switching means includes resistive means connected between said control means and a control input of the switching means for reducing the current of the control signals, and capacitive means connected in parallel with said resistive means for expediting the transmission of said control signal to said switching means.

6. A high speed switching circuit as defined in claim 2, wherein the gain factor associated with the pair of transconductive transistors for each switching means is at least 500.

7. A high speed switching circuit as defined in claim 2, wherein the pair of transconductive transistors in each switching means includes a series pass transistor which operates in its active region in a state of near saturation when in the conductive state so as to minimize the power dissipation associated with said series pass transistor.

8. A high speed switching circuit as defined in claim 1, wherein said control means generates higher and lower voltage pulses for changing the conductive state of said first and second switching means in complementary fashion.

9. A high speed switching circuit as defined in claim 3, wherein each of said switching means includes a trigger transistor and a series pass transistor, wherein the collector of the trigger transistor is connected to the base of the series pass transistor.

10. A high speed switching circuit as defined in claim 9, wherein the cutoff means is a cutoff transistor, and the collector of said cutoff transistor is connected to the base of the series pass transistor for dissipating any residual charge between the series pass transistor and the collector of the trigger transistor when the state of said trigger transistor changes from conductive to non-conductive.

11. A high speed switching circuit having a high input impedance and a low output impedance for controlling a current flow generated by a current source to a load comprising:
a transistor switching assembly including a pair of transconductive transistors and a cut-off transistor, wherein said transconductive transistors include a trigger transistor and a series pass transistor of opposite conductivity types, the emitter of the trigger transistor and the collector of the series pass transistor being commonly connected to said current source, and the collector of the trigger transistor being connected to the base of the series pass transistor, wherein the conductance of the cut-off transistor is complementary to the conductance of the trigger transistor and the cut-off transistor is connected so as to create a conductive path between the base of the series pass transistor and a ground means when the trigger transistor is not conducting.

12. A high speed switching circuit as defined in claim 11, further including a second transistor switching assembly that likewise has a pair of transconductive transistors including a trigger transistor and a series pass transistor, and a cut-off transistor, wherein the conductivity of the transconductive transistors of the first switching assembly is complementary to the conductivity of the transconductive transistors of the second transistor switching assembly, and wherein the outputs of the first and second transistor switching assemblies are connected to a load and a dummy load, respectively.

13. A high speed switching circuit as defined in claim 11, wherein the series pass transistor is operated in a state of near saturation to minimize both switching response time and the power dissipation associated with the impedance of the series pass transistor.

14. A high speed switching circuit as defined in claim 12, further comprising a control circuit for generating first and second control signals that change the conductive state of said first and second transistor switching assemblies in a complementary fashion to steer said current alternately to said load and dummy load, respectively.

15. A high speed switching circuit having a high input impedance and a low output impedance for controlling the transmission to a load of a current flow generated by a current source, comprising:
first and second transistor switching assemblies, the input of each assembly being connected to the current flow generated by the current source, the outputs of the assemblies being connected to a load and a dummy load, respectively, wherein each switching assembly includes a pair of transconductively connected transistors including a trigger transistor whose output is connected to the base of a series pass transistor, and wherein each assembly further includes a cut-off transistor connected between the base of the series pass transistor and a reference level means for dissipating any residual charge at the base of the series pass transistor when the state of the trigger transistor changes between conductive and non-conductive, and
a control circuit for generating first and second control signals that change the conductive state of said first and second transistor switching assemblies in complementary fashion to selectively steer said current to one of said load and said dummy load.

16. A high speed switching circuit as defined in claim 15, wherein said load and said dummy load are of approximately the same impedance.

17. A high speed switching circuit as defined in claim 15, wherein the gain associated with the pair of transconductive transistors is at least 800.

18. A high speed switching circuit as defined in claim 15, wherein the input impedance of said switching circuit is between about 14 and about 25 kiloohms while the output impedance is between about 10 and about 60 ohms.

19. A high speed switching circuit as defined in claim 15, wherein the switching time associated with the switching assemblies is between about 2 and 5 nanoseconds.

20. A high speed switching circuit as defined in claim 15, wherein each of said transistor switching assemblies includes a resistive means between said control circuit and the base of the trigger transistor for reducing the current of the control signals, and a capacitive means connected in parallel with said resistive means for expediting the transmission of said control signal to said transistor assembly.

21. A high speed switching circuit as defined in claim 15, wherein the series pass transistor of each of said switching assemblies operates in the near saturation region to minimize both the time needed to change conductive state and the power losses associated with transistor impedance.

* * * * *